United States Patent
Cheng et al.

(10) Patent No.: US 11,974,387 B2
(45) Date of Patent: Apr. 30, 2024

(54) POWER MODULE AND HEAT SINK SYSTEM

(71) Applicant: FOSHAN NATIONSTAR OPTOELECTRONICS CO., LTD., Foshan (CN)

(72) Inventors: Nianbin Cheng, Foshan (CN); Cheng Li, Foshan (CN); Lifang Liang, Foshan (CN); Yikai Yuan, Foshan (CN); Honggui Zhan, Foshan (CN); Xiangxuan Tan, Foshan (CN)

(73) Assignee: FOSHAN NATIONSTAR OPTOELECTRONICS CO., LTD., Foshan (CN)

(*) Notice: Subject to any disclaimer, the term of this patent is extended or adjusted under 35 U.S.C. 154(b) by 170 days.

(21) Appl. No.: 17/867,774

(22) Filed: Jul. 19, 2022

(65) Prior Publication Data
US 2023/0217580 A1 Jul. 6, 2023

(30) Foreign Application Priority Data
Dec. 31, 2021 (CN) .......................... 202111661209.9

(51) Int. Cl.
*H05K 1/02* (2006.01)
*H05K 1/18* (2006.01)
(Continued)

(52) U.S. Cl.
CPC ............. *H05K 1/021* (2013.01); *H05K 3/284* (2013.01); *H05K 1/181* (2013.01);
(Continued)

(58) Field of Classification Search
CPC ........... H05K 7/20254; H05K 7/20927; H05K 1/021; H05K 1/181; H05K 3/284;
(Continued)

(56) References Cited

U.S. PATENT DOCUMENTS 5,631,809 A * 5/1997 Takagi ................ H01L 23/3107
257/659
7,919,854 B2 * 4/2011 Stolze .................... H05K 1/141
257/E23.105
(Continued)

FOREIGN PATENT DOCUMENTS

JP 2013038105 A * 2/2013 ............. H01L 24/33

*Primary Examiner* — Zachary Pape
(74) *Attorney, Agent, or Firm* — Culhane Meadows PLLC; Stephen J. Weed

(57) ABSTRACT

Provided are a power module and a heat sink system. The power module includes a first circuit board, a second circuit board, at least one discrete component and an encapsulation body. One discrete component includes a lead frame and at least one chip, the lead frame is disposed between the first circuit board and the second circuit board, the lead frame includes two end faces and multiple mounting lateral surfaces connected in sequence, an angle is formed between one end face and one mounting lateral surface, one of the two end faces is electrically connected to the first circuit board and the other of the two end faces is electrically connected to the second circuit board, and the chip is disposed on each of the multiple mounting lateral surfaces. The encapsulation body is configured to pot a space between the first circuit board and the second circuit board.

19 Claims, 8 Drawing Sheets

(51) Int. Cl.
*H05K 3/28* (2006.01)
*H05K 7/20* (2006.01)

(52) U.S. Cl.
CPC ..... *H05K 7/20254* (2013.01); *H05K 7/20927* (2013.01); *H05K 2201/066* (2013.01)

(58) Field of Classification Search
CPC .......... H05K 2201/066; H01L 23/3675; H01L 23/481; H01L 23/49568; H01L 23/3677; H01L 23/473; H01L 23/04; H01L 23/10; H01L 25/072; H01L 29/42304; H01L 24/41; H01L 2224/0603; H01L 2224/48472; H01L 2224/4903
See application file for complete search history.

(56) References Cited

U.S. PATENT DOCUMENTS

| | | | |
|---|---|---|---|
| 8,125,781 B2 * | 2/2012 | Mamitsu | H01L 25/117 361/689 |
| 10,424,570 B2 * | 9/2019 | Kimura | H01L 25/112 |
| 11,653,481 B2 * | 5/2023 | Sano | H02P 27/06 361/699 |
| 2006/0284308 A1 * | 12/2006 | Harada | H01L 23/473 257/729 |
| 2023/0037158 A1 * | 2/2023 | Legen | H01L 23/047 |

* cited by examiner

POWER MODULE AND HEAT SINK SYSTEM

CROSS-REFERENCE TO RELATED APPLICATION(S)

This application claims priority to Chinese Patent Application No. 202111661209.9, filed Dec. 31, 2021, the disclosure of which is incorporated herein by reference in its entirety.

TECHNICAL FIELD

The present disclosure relates to the technical field of semiconductor devices and, in particular, to a power module and a heat sink system including the power module.

BACKGROUND

A power module made up of discrete components has the characteristics of small size and flexible and convenient use. With the development of semiconductors, the power of a chip gets increasingly larger, and thus it is a difficult challenge for a power module to maintain the advantage of small size while increasing the power density. Subject to the volume of a power module, the power density cap is predictable. To break through the problem of the power density ceiling of the power module, research on power modules having ultra-high power is carried out.

In the related art, chips of the power module are mounted to the substrate, and the substrate uses a flat structure; therefore, a large number of leads are needed to connect the chips, and in the manufacturing process, the leads are welded, the chips are mounted, and then the components are encapsulated by using a stiffer housing. To reduce the size of the housing, the housing is mostly configured to be a hollow structure. When the housing is squeezed, the middle area of the housing is easy to collapse, causing the chips or the connection lines to break and resulting in damage to the module. If a support column is disposed inside the housing, the size of the module is increased, not conducive to improving the power density of the module. When a relatively large number of chips are inside the module, the chips generate a large amount of heat. In this case, when the module does not dissipate the heat timely, the heat accumulates in the module, causing the temperature of the chips to rise. The high temperature affects the operation efficiency of the chips, thereby affecting the performance of the module.

SUMMARY

An object of embodiments of the present disclosure is to provide a power module having a simple structure, a high resistance to pressure and a high power density.

Another object of the embodiments of the present disclosure is to provide a heat sink system having a stable performance.

To achieve the preceding objects, the present disclosure adopts the technical solutions below.

In a first aspect, a power module is provided. The power module includes a first circuit board, a second circuit board, at least one discrete component and an encapsulation body.

The second circuit board is opposite to and spaced apart from the first circuit board.

One discrete component includes a lead frame and at least one chip. The lead frame is disposed between the first circuit board and the second circuit board. The lead frame includes two end faces and multiple mounting lateral surfaces connected in sequence. An angle is formed between one end face and one mounting lateral surface. One end face is electrically connected to the first circuit board. The other end face is electrically connected to the second circuit board. The at least one chip is disposed on at least one mounting lateral surface.

The encapsulation body is configured to pot a space between the first circuit board and the second circuit board. The at least one discrete component is embedded in the encapsulation body. Multiple electrode tabs are encapsulated in the encapsulation body. One end of one electrode tab is connected to the first circuit board or the second circuit board. Another end of the one electrode tab extends out of the encapsulation body.

In a solution of the power module, a recess is formed in a mounting lateral surface of the plurality of mounting lateral surfaces, and a chip of the at least one chip is disposed in the recess.

In a solution of the power module, the lead frame includes a frame top and a frame bottom. The frame top is connected to the first circuit board. The frame bottom is connected to the second circuit board. The frame top is an integral metal structure. The multiple mounting lateral surfaces are disposed on the frame top. The frame bottom includes at least one first electrode plate and at least one second electrode plate. The frame top, the at least one first electrode plate and the at least one second electrode plate are insulated from each other. A first electrode of one chip is electrically connected to one first electrode plate. A second electrode of the one chip is electrically connected to one second electrode plate. A third electrode of the one chip is electrically connected to the frame top.

In a solution of the power module, the frame bottom includes one first electrode plate and one second electrode plate. An angle is formed between the one first electrode plate and the one second electrode plate. The one first electrode plate partially overlaps the one second electrode plate. A first insulating plate is disposed at the position of overlapping between the one first electrode plate and the one second electrode plate.

In a solution of the power module, the one first electrode plate is formed with a first slot, and the one second electrode plate is formed with a second slot. The first insulating plate is disposed in the second slot. The bottom of the second slot and the first insulating plate are both embedded in the first slot. The lower surface of the one first electrode plate is flush with the lower surface of the one second electrode plate.

In a solution of the power module, the frame bottom includes two first electrode plates and two second electrode plates. The two first electrode plates are staggered and spaced apart to form empty spaces. The two second electrode plates are disposed in the empty spaces in a one-to-one manner. A second insulating plate is disposed between each first electrode plate and a second electrode plate adjacent to the each first electrode plate.

In a solution of the power module, the lower surface of the frame top is recessed and formed with a notch. The two first electrode plates and the two second electrode plates are disposed in the notch. The second insulating plate is also disposed between the notch and the first electrode plate and between the notch and the second electrode plate. Lower surfaces of the two first electrode plates and lower surfaces of the two second electrode plates are flush with the lower surface of the frame top.

In a solution of the power module, at least one of the following applies: The first circuit board has a first lateral surface facing away from the lead frame, and the encapsulation body extends to the first lateral surface such that the first lateral surface is partially exposed from the encapsulation body; or the second circuit board has a second lateral surface facing away from the lead frame, and the encapsulation body extends to the second lateral surface such that the second lateral surface is partially exposed from the encapsulation body.

In a second aspect, a heat sink system is provided. The heat sink system includes the preceding power module and also includes a heat sink. The heat sink is disposed on the power module. The heat sink is connected to the first circuit board and the second circuit board.

In a solution of the power module, the heat sink includes two heat sink members. The two heat sink members are electrically connected to the first circuit board and the second circuit board respectively. A chamber is disposed inside each heat sink member. The chamber is configured such that a coolant is able to flow through the chamber. Each heat sink member is formed with at least two holes communicating with the chamber. The at least two holes are configured for inflow and outflow of the coolant. At least one hole of one heat sink member communicates with at least one hole of the other heat sink member. The at least two holes are configured such that the coolant is able to flow in through one hole of one heat sink member and flow out through one hole of the other heat sink member.

In a solution of the power module, each heat sink member includes a heat sink body and a cover plate. The heat sink body has an opening. The cover plate blocks the opening so that the chamber is formed. The each heat sink member is formed with three holes. Two holes of the three holes are formed in the heat sink body. One of the three holes is formed in the cover plate. The two holes in the heat sink body of one of the two heat sink members communicate with the two holes in the heat sink body of the other of the two heat sink members in a one-to-one manner.

In a solution of the power module, several heat sink bars protrude from an inner wall of the heat sink body.

BRIEF DESCRIPTION OF DRAWINGS

The present disclosure is described in detail according to the drawings and embodiments.

Figure 1:
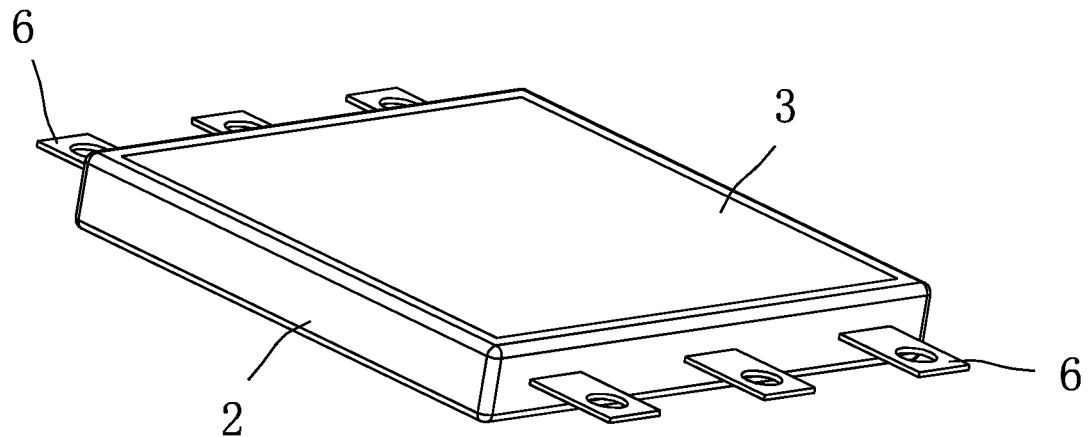
FIG. 1 is a schematic view of a power module according to an embodiment of the present disclosure.

REFERENCE LIST 1 chip
2 encapsulation body
3 first circuit board
31 first lateral surface
4 second circuit board
41 second lateral surface
5 lead frame
51 frame top
511 mounting lateral surface
512 recess
513 notch
52 frame bottom
521 first electrode plate
5211 first slot
522 second electrode plate
5221 second slot
6 electrode tab
7 first lead
8 second lead
9 heat sink member
91 heat sink body
93 hole
911 heat sink bar
92 cover plate
10 solder
11 second insulating plate
12 first insulating plate
13 third insulating plate

DETAILED DESCRIPTION

To make solved problems, adopted solutions and achieved effects of the present disclosure clearer, the solution of the present disclosure is described in conjunction with the drawings and embodiments. The embodiments below are part, not all, of embodiments of the present disclosure. Based on the examples of the present disclosure, all other examples obtained by those skilled in the art are within the scope of the present disclosure on the premise that no creative work is done.

In the description of the present disclosure, unless otherwise expressly specified and limited, the term "connected to each other", "connected" or "secured" is to be construed in a broad sense, for example, as securely connected, detachably connected or integrated; mechanically connected or electrically connected; directly connected to each other or indirectly connected to each other via an intermediary; or internally connected between two components or interaction relations between two components. For those of ordinary skill in the art, meanings of the preceding terms in the present disclosure may be understood based on situations.

Figure 2:
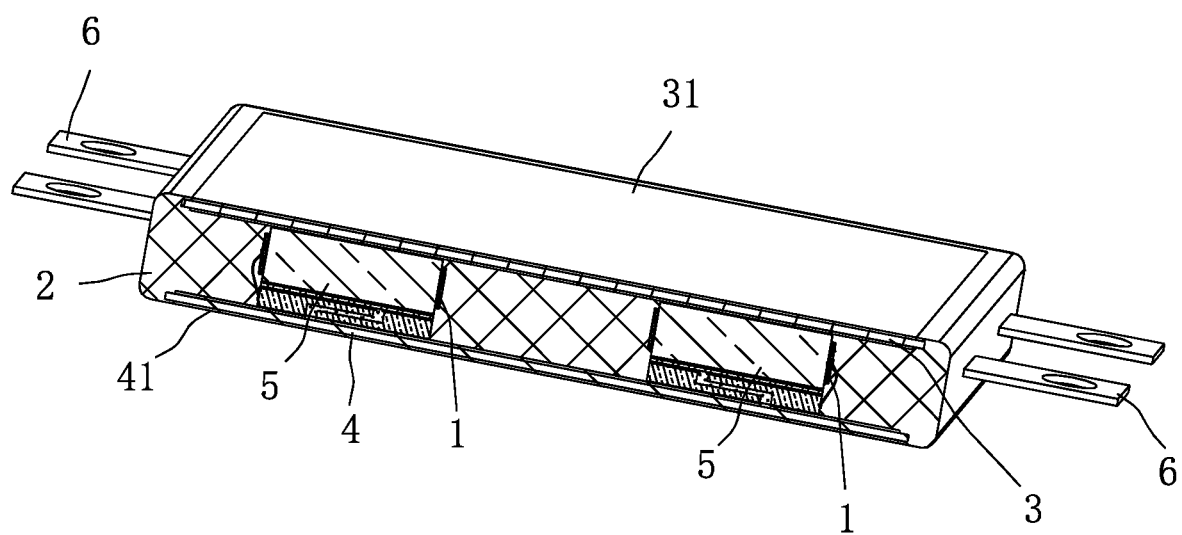
FIG. 2 is a sectional view of a power module according to an embodiment of the present disclosure.
Figure 3:
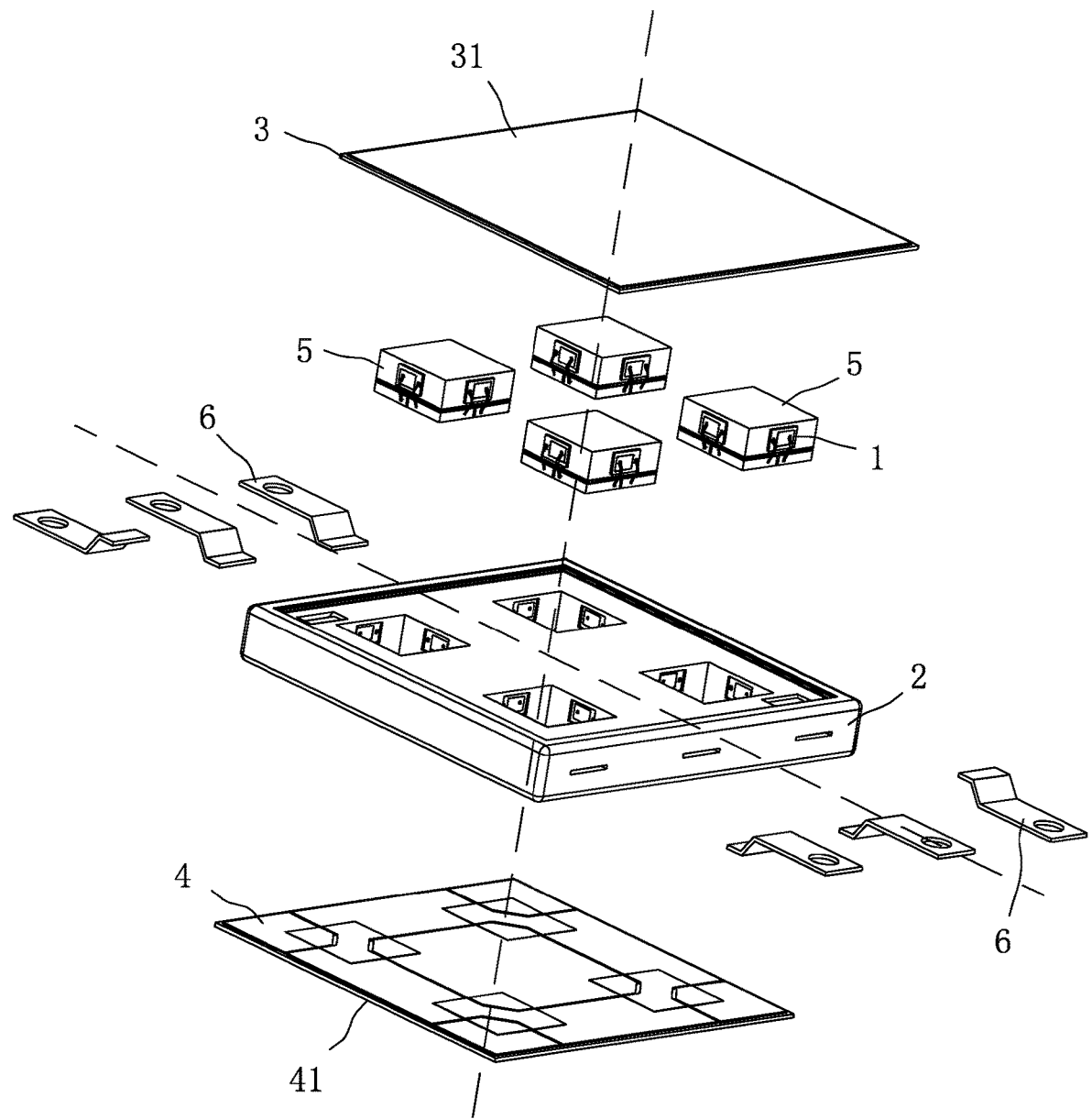
FIG. 3 is an exploded view of a power module according to an embodiment of the present disclosure.
Figure 4:
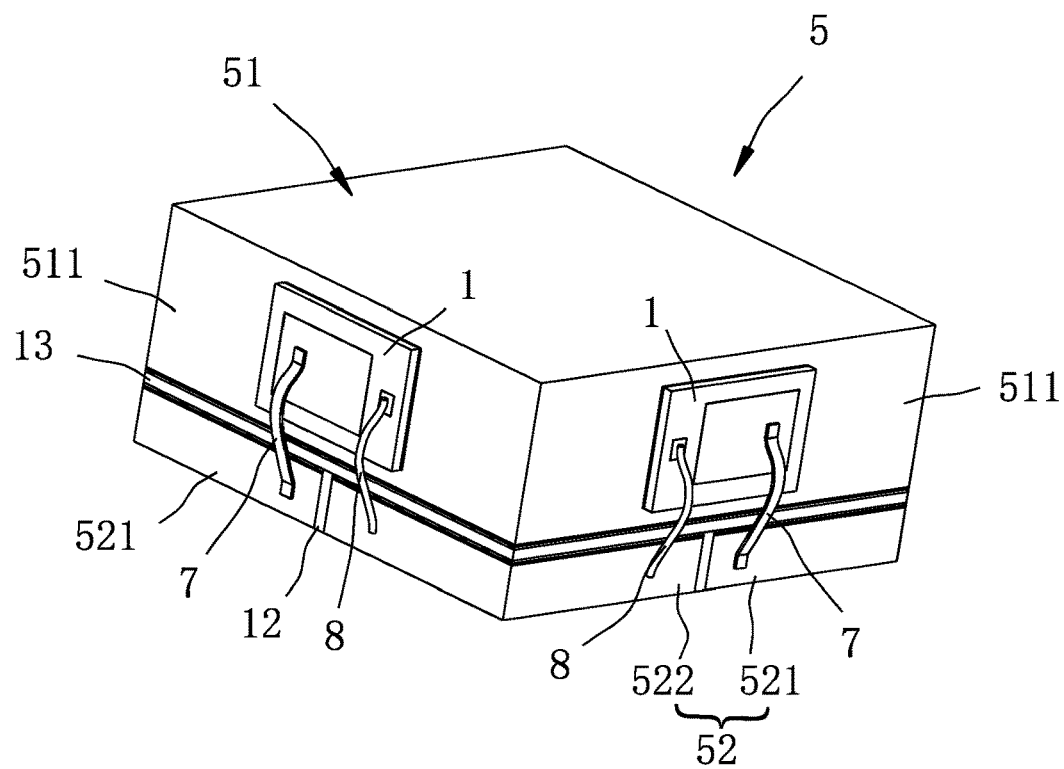
FIG. 4 is a schematic view of a lead frame and chips according to embodiment one of the present disclosure.

As shown FIGS. 1 to 3, a power module provided by the present disclosure includes a first circuit board 3, a second circuit board 4, discrete components and an encapsulation body 2. The second circuit board 4 is opposite to and spaced apart from the first circuit board 3. At least one discrete component is provided. One discrete component includes a lead frame 5 and chips 1. The lead frame 5 is disposed between the first circuit board 3 and the second circuit board 4. Referring to FIGS. 4 to 8, the lead frame 5 includes two end faces and multiple mounting lateral surfaces 511 connected in sequence. An angle is formed between one end face and one mounting lateral surface 511. One of the two end faces of the lead frame 5 is electrically connected to the first circuit board 3. The other of the two end faces is electrically connected to the second circuit board 4. Chips 1 are secured to the mounting lateral surface 511. The encapsulation body 2 is configured to pot a space between the first circuit board 3 and the second circuit board 4. The discrete components are embedded in the encapsulation body 2. Multiple electrode tabs 6 are encapsulated in the encapsulation body 2. One end of one electrode tab 6 is connected to the first circuit board 3 or the second circuit board 4. The other end of the one electrode tab 6 extends out of the encapsulation body 2. The lead frame 5 plays a supporting role. When the first circuit board 3 and the second circuit board 4 are squeezed, the lead frame 5 can support the first circuit board 3 and the second circuit board 4 to avoid the circuit breakage of the first circuit board 3 and the second circuit board 4 caused by the deformation of the first circuit board and the second circuit board under pressure. The lead frame 5 is not easily deformed by the pressure. That is, when the external force squeezes the power module, the lead frame 5 can protect the chip 1 to avoid the chip 1 from breaking under pressure, improving the pressure resistance of the lead frame 5. Multiple mounting lateral surfaces 511 are disposed on one lead frame 5, and the chip 1 can be mounted on each mounting lateral surface 511. In this manner, the density of chips 1 in the power module can be increased, and thus the power of the power module can be increased. It is to be understood that the cost of the chip 1 increases geometrically with the power of the chip 1. In this embodiment, after the density of chips 1 in the power module is increased, the power of one chip 1 may be appropriately reduced, that is, the reduced power of one chip 1 is compensated for by an increased number of chips 1. In this manner, the manufacturing cost of the discrete component is greatly reduced. The chips 1 are disposed on the lateral surfaces 511 of the lead frame 5 so that a two-dimensional circuit structure is converted into a three-dimensional circuit structure, and the space of the power module in the vertical direction is fully used. Thus, not only the overall size of the power module can be reduced, but also the electrodes of the chip 1 are easy to lead out, thereby simplifying the circuit structure inside the power module, and facilitating reducing the manufacturing cost of the power module.

In this embodiment, one power module is provided with four discrete components. Lead frames 5 of the four discrete components are arranged in a matrix. One lead frame 5 is a hexahedral structure. One lead frame 5 includes four mounting lateral surfaces 511. One chip 1 is disposed on each lateral surface 511 separately. The four mounting lateral surfaces 511 are annularly and uniformly distributed around the central axis of the lead frame 5. In other embodiments, the number of mounting lateral surfaces 511 on one lead frame 5 is not limited to four, and may be two, three, five or even more. The mounting lateral surfaces 511 are annularly and uniformly distributed so that chips 1 on the mounting lateral surfaces 511 can have symmetrical circuit structures, and the first circuit board 3 and the second circuit board 4 can have symmetrical circuit structures, reducing signal delays of each chip 1 due to different circuit structures and improving the performance of the power module.

In an embodiment, the lead frame 5 includes a frame top 51 and a frame bottom 52. The frame top 51 is connected to the first circuit board 3. The frame bottom 52 is connected to the second circuit board 4. The frame top 51 is an integral metal structure. The multiple mounting lateral surfaces 511 are disposed on the frame top 51. The frame bottom 52 includes at least one first electrode plate 521 and at least one second electrode plate 522. The frame top 51, the at least one first electrode plate 521 and the at least one second electrode plate 522 are insulated from each other. One chip 1 includes a first electrode, a second electrode and a third electrode. The first electrode of the one chip 1 is electrically connected to one first electrode plate 521. The second electrode of the one chip 1 is electrically connected to one second electrode plate 522. The third electrode of the one chip 1 is electrically connected to the frame top 51. In this embodiment, the number of electrodes of the chip 1 is three; therefore, the first circuit board 3 and the second circuit board 4 have different circuit structures, so that the first circuit board 3 and the second circuit board 4 can satisfy the operational requirements of the chip 1. The first electrode, the second electrode and the third electrode of one chip 1 are connected to one first electrode plate 521, one second electrode plate 522 and the frame top 51 respectively, and thus the subsequent connection between the chip 1 and the external circuit can be facilitated. The frame top 51 can make third electrodes of all chips 1 on the lead frame 5 be interconnected to achieve the electrode sharing between the chips 1. Moreover, the first electrode plate 521 and the second electrode plate 522 can also enable the electrode sharing between the chips 1. That is, first electrodes of two adjacent chips 1 can be connected to the same first electrode plate 521, and second electrodes of two adjacent chips 1 can be connected to the same second electrode plate 522, facilitating simplifying the circuit structure on the first circuit board 3 and the circuit structure on the second circuit board 4. In an embodiment, the first electrode of one chip 1 may be electrically connected to one first electrode plate 521 through a first lead 7, the second electrode of the one chip 1 may be electrically connected to one second electrode plate 522 through a second lead 8, and the third electrode of the one chip 1 is welded to the frame top 51.

In this embodiment, the frame top 51, the first electrode plate 521 and the second electrode plate 522 are all made of pure copper. In addition, the frame top 51, the first electrode plate 521 and the second electrode plate 522 may also be made of a copper-zinc alloy or a copper-aluminum alloy, the metal material of the frame top 51, the first electrode plate 521 and the second electrode plate 522 is not limited to the preceding materials, but only needs to satisfy the electrical conductivity and a certain mechanical strength.

Figure 5:
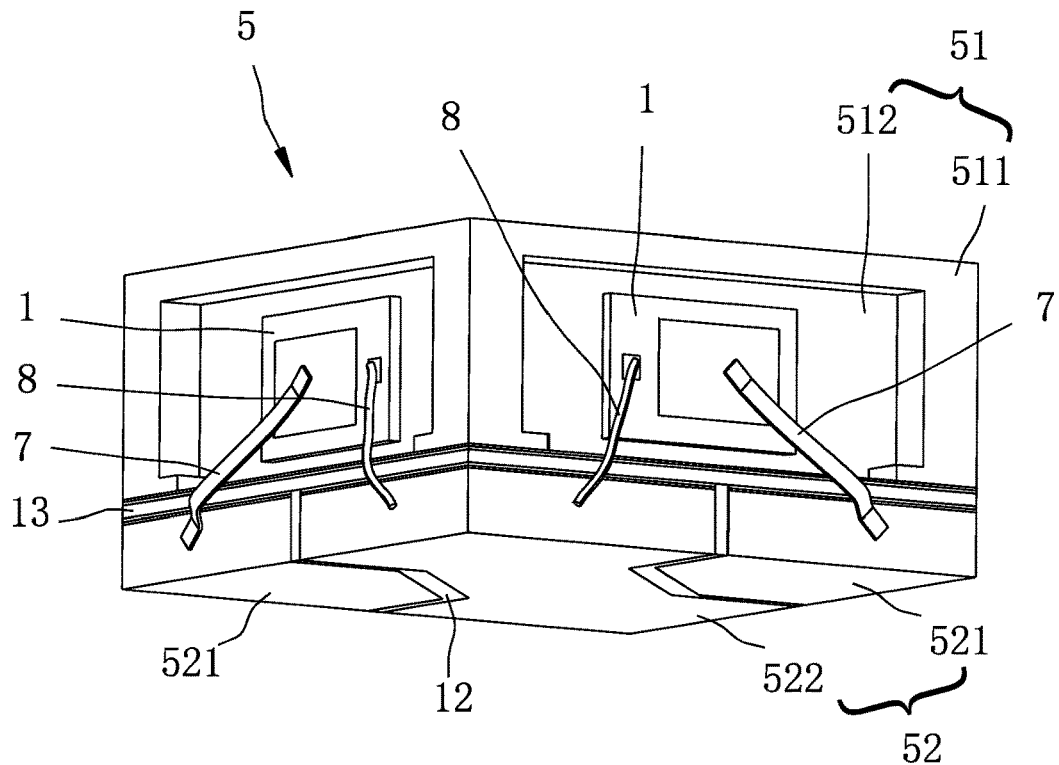
FIG. 5 is a schematic view of a lead frame and chips according to embodiment two of the present disclosure.
Figure 6:
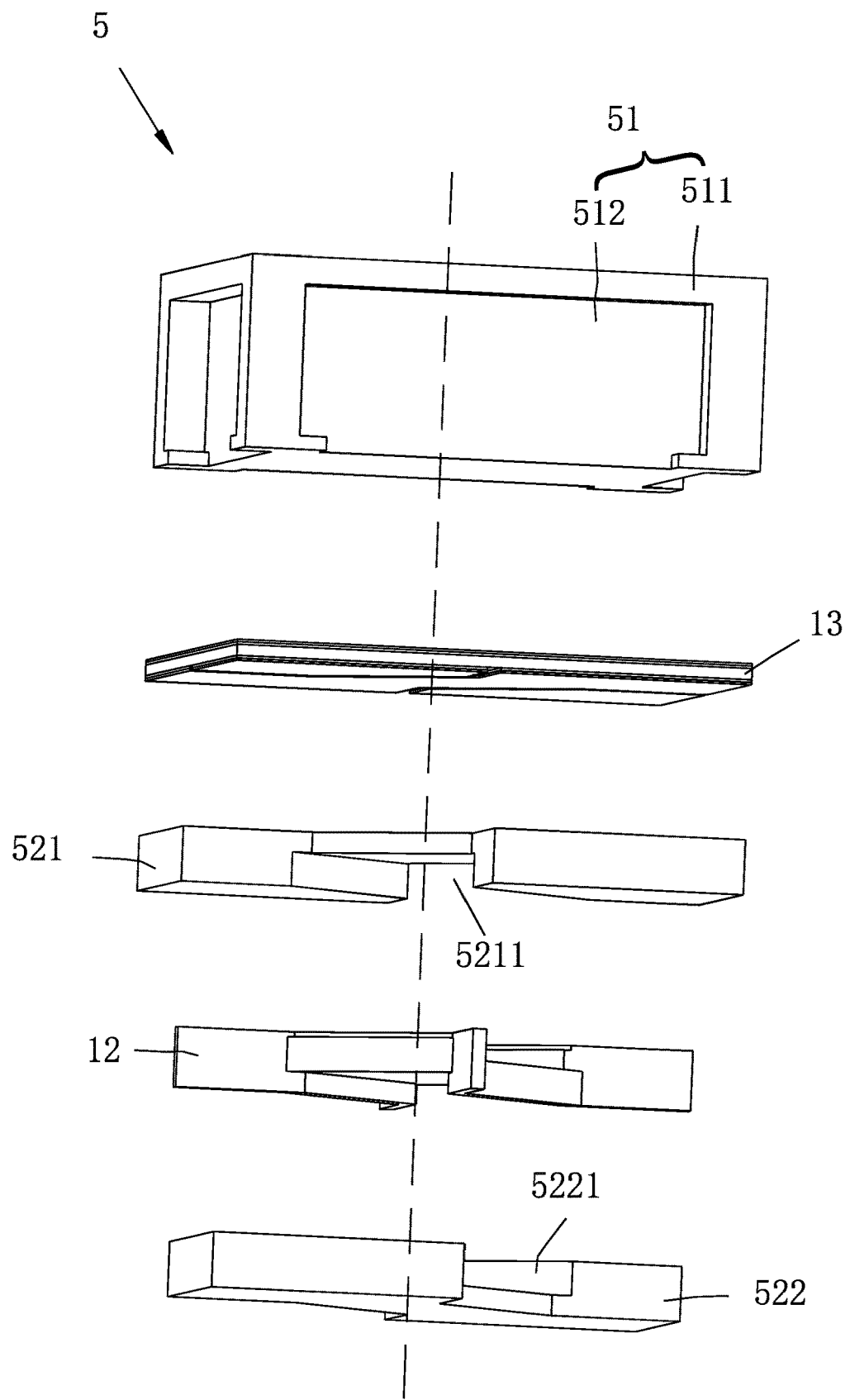
FIG. 6 is an exploded view of the lead frame according to embodiment two of the present disclosure.

Referring to FIGS. 5 and 6, in one embodiment, the frame bottom 52 includes one first electrode plate 521 and one second electrode plate 522, first electrodes of four chips 1 on the lead frame 5 may share one first electrode plate 521, and second electrodes of the four chips 1 on the lead frame 5 may share one second electrode plate 522. In this manner, the circuit structure on the first circuit board 3 and the circuit structure on the second circuit board 4 can be simplified.

In an embodiment, an angle is formed between the one first electrode plate 521 and the one second electrode plate 522, the one first electrode plate 521 partially overlaps the one second electrode plate 522, and a first insulating plate 12 is disposed at the position of overlapping between the one first electrode plate 521 and the one second electrode plate 522. With this arrangement, the first electrode and the second electrode of the chip 1 on each mounting lateral surface 511 can be easily connected to the second circuit board 4 through the first electrode plate 521 and the second electrode plate 522, and thus the circuit structure on the second circuit board 4 is simplified.

In an embodiment, the first electrode plate 521 is formed with a first slot 5211, the second electrode plate 522 is formed with a second slot 5221, the first insulating plate 12 is disposed in the second slot 5221, and the bottom of the second slot 5221 and the first insulating plate 12 are both embedded in the first slot 5211, so that the lower surface of the one first electrode plate 521 is flush with the lower surface of the one second electrode plate 522. With the first slot 5211 and the second slot 5221, the local thickness of the first electrode plate 521 and the local thickness of the second electrode plate 522 can be reduced, thereby reducing the size of the lead frame 5. Thus, the size of the power module is reduced, and the power density of the power module is provided.

Figure 7:
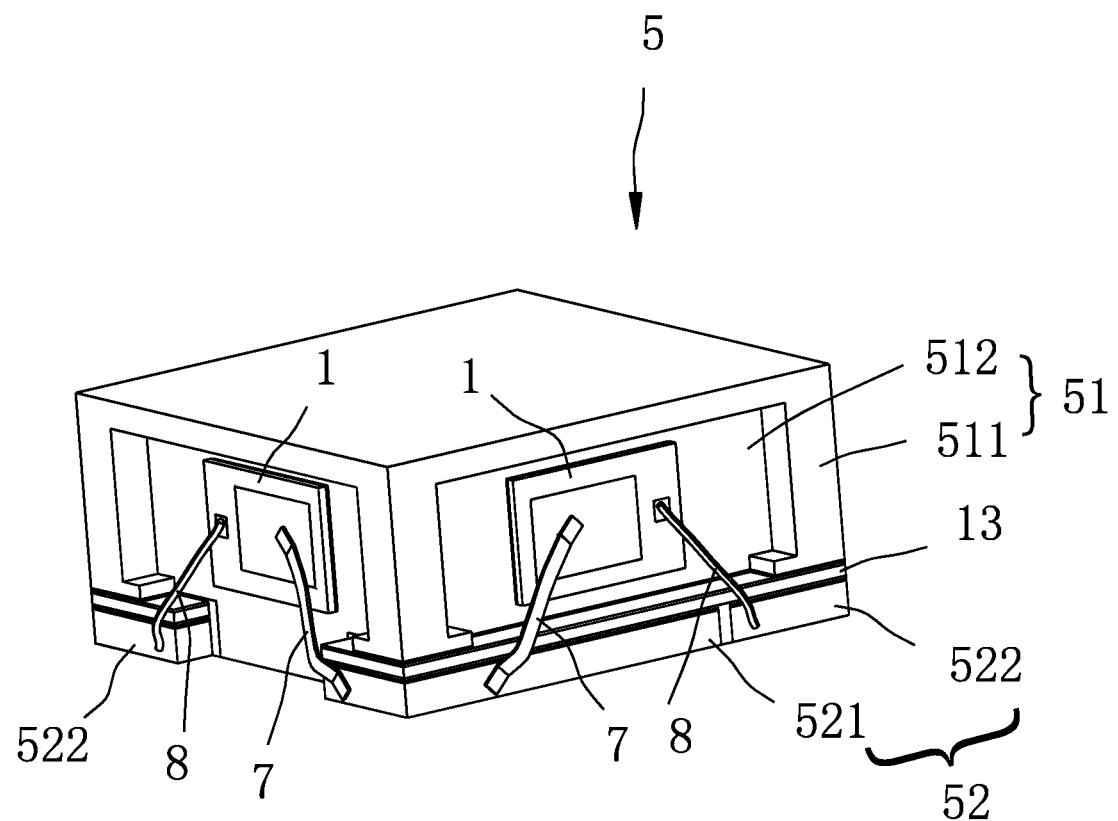
FIG. 7 is a schematic view of a lead frame and chips according to embodiment three of the present disclosure.
Figure 8:
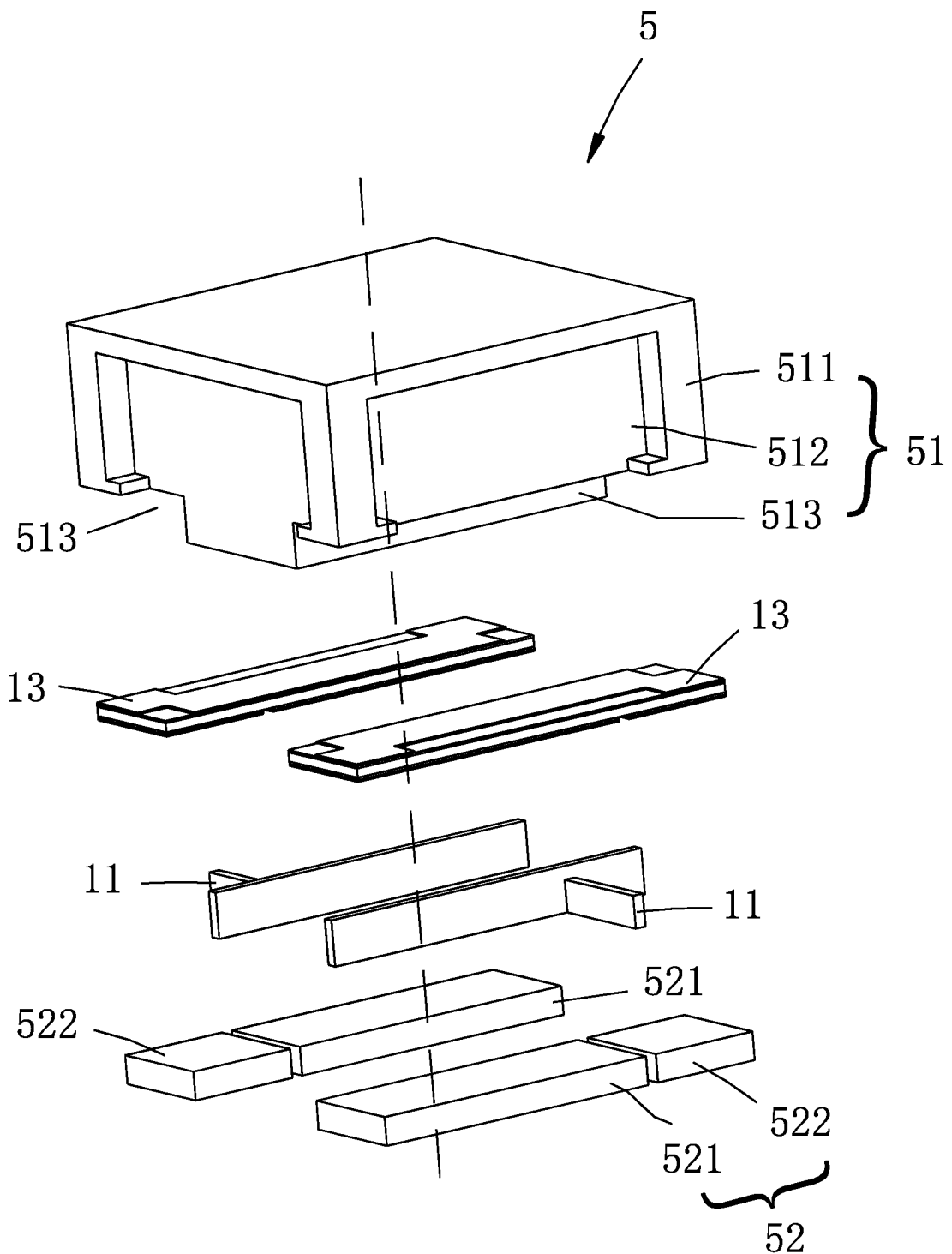
FIG. 8 is an exploded view of the lead frame according to embodiment three of the present disclosure.

In another embodiment, referring to FIGS. 7 and 8, one frame bottom 52 includes two first electrode plates 521 and two second electrode plates 522, the two first electrode plates 521 are staggered and spaced apart to form empty spaces, the two second electrode plates 522 are disposed in the empty spaces in a one-to-one manner, a second insulating plate 11 is disposed between each first electrode plate 521 and a second electrode plate 522 adjacent to the each first electrode plate 5212. In an embodiment, the first electrode plate 521 and the second electrode plate 522 are staggered and spaced apart, and one of the two first electrode plates 521 and one of the two second electrode plates 522 form one rectangular structure. Therefore, every two chips 1 on one lead frame 5 share one first electrode plate 521 and one second electrode plate 522, thereby reducing the difficulty in connecting the chip electrodes to the first electrode plate 521 and in connecting the chip electrodes to the second electrode plate 522, and also simplifying the circuit structure on the first circuit board 3 and the circuit structure on the second circuit board 4.

In an embodiment, the lower surface of the frame top 51 is recessed and formed with a notch 513. The two first electrode plates 521 and the two second electrode plates 522 are disposed in the notch 513. The second insulating plate 11 is also disposed between the notch 513 and the first electrode plate 521 and between the notch 513 and the second electrode plate 522. Lower surfaces of the two first electrode plates 521 and lower surfaces of the two second electrode plates 522 are flush with the lower surface of the frame top 51. The notch 513 disposed on the lower surface of the frame top 51, the notch 513 is configured to accommodate the first electrode plate 521 and the second electrode plate 522, and the lower surface of the first electrode plate 521 and the lower surface of the second electrode plate 522 are flush with the lower surface of the frame top 51. In this manner, the space occupied by the frame top 51, the first electrode plate 521 and the second electrode plate 522 in the vertical direction can be reduced, the height of the frame top 51 is the height of the lead frame 5, and thus the height of the lead frame 5 can be reduced, thereby reducing the size of the power module. In this embodiment, two notches 513 are provided, the two first electrode plates 521 are disposed in the two notches 513 in a one-to-one manner, and the two second electrode plates 522 are also disposed in the two notches 513 in a one-to-one manner.

In an embodiment, a third insulating plate 13 is disposed between the frame top 51 and the frame bottom 52. The third insulating plate 13 enables the frame top 51 to be insulated and spaced apart from the first electrode plate 521 and the second electrode plate 522, thereby preventing the electrical contact between the frame top 51 and the first electrode plate 521 and between the frame top 51 and the second electrode plate 522 to prevent a short circuit of each chip 1.

In this embodiment, the first insulating plate 12 is made of an aluminum nitride material or a silicon nitride material, the second insulating plate 11 and the third insulating plate 13 may also be made of the aluminum nitride material or the silicon nitride material, materials of the first insulating plate 12, the second insulating plate 11 and the third insulating plate 13 may be same or different, and the materials of the first insulating plate 12, the second insulating plate 11 and the third insulating plate 13 may be selected according to actual needs.

In an embodiment, referring to FIGS. 5 to 8, recesses 512 are formed in mounting lateral surfaces 511, and the chips 1 are disposed in the recesses 512. In this embodiment, the first electrode of one chip 1 is connected to one first electrode plate 521 through a first lead 7, the second electrode of the one chip 1 is connected to one second electrode plate 522 through a second lead 8, the third electrode of one chip 1 is welded to the frame top 51, and one chip 1 is disposed in one recess 512. Thus, not only the arc height of the first lead 7 and the second lead 8 which are connecting the electrodes of the chip 1 to the lead frame 5 can be reduced, but also the heat dissipation area of the lead frame 5 can be increased, thereby facilitating improving the heat dissipation capability. Of course, referring to FIG. 4, the mounting lateral surface 511 may be provided with no recess 512.

It is to be noted that, in this embodiment, the recess 512 is configured to be a rectangle, the length of the rectangle is greater than the length of the chip 1, and the width of the rectangle is greater than the width of the chip 1. When the chip 1 is disposed in the recess 512, a certain predetermined distance is set between each edge of the recess 512 and the chip 1, and the predetermined distance may be determined according to the actual process. On the one hand, a certain predetermined distance is set between each edge of the recess 512 and the chip 1, which makes it easier to place the chip 1; and on the other hand, a certain predetermined distance can form a larger heat dissipation gap, facilitating the heat dissipation of the chip 1.

In an embodiment, referring to FIGS. 1 to 3, the first circuit board 3 has a first lateral surface 31 facing away from the lead frame 5, and the encapsulation body 2 extends to the first lateral surface 31 such that the first lateral surface 31 is partially exposed from the encapsulation body 2. The second circuit board 4 has a second lateral surface 41 facing away from the lead frame 5, and the encapsulation body 2 extends to the second lateral surface 41 so that the second lateral surface 41 is exposed from the encapsulation body 2. The encapsulation body 2 extends to the first lateral surface 31 and the second lateral surface 41, so that the encapsulation body 2 can wrap a circumference of the first circuit board 3 and a circumference of the second circuit board 4 to enhance the connection strength between the first circuit board 3 and the encapsulation body 2 as well as between the second circuit board 4 and the encapsulation body 2. The first lateral surface 31 and the second lateral surface 41 are partially exposed from the encapsulation body 2, it is easy for the circuit structure on the first circuit board 3 and the circuit structure on the second circuit board 4 to dissipate heat, the heat on the chip 1 can also be conducted to the first circuit board 3 and the second circuit board 4 through the lead frame 5. That is, the first circuit board 3 and the second circuit board 4 can act as a heat dissipation structure for the power module.

In an embodiment, the first electrode, the second electrode and the third electrode of the chip 1 are electrically connected to different electrode tabs 6 when the circuits of the lead frame 5, the first circuit board 3 and the second circuit board 4 are conductive. In this embodiment, six electrode tabs 6 are provided, two electrode tabs 6 are electrically connected to the first electrode, another two electrode tabs 6 are electrically connected to the second electrode, and the remaining two electrode tabs 6 are electrically connected to the third electrode. In other embodiments, the number of electrode tabs 6 may be selected according to the actual power of the chip 1. For example, the number of electrode tabs 6 may be three, nine and the like.

Figure 9:
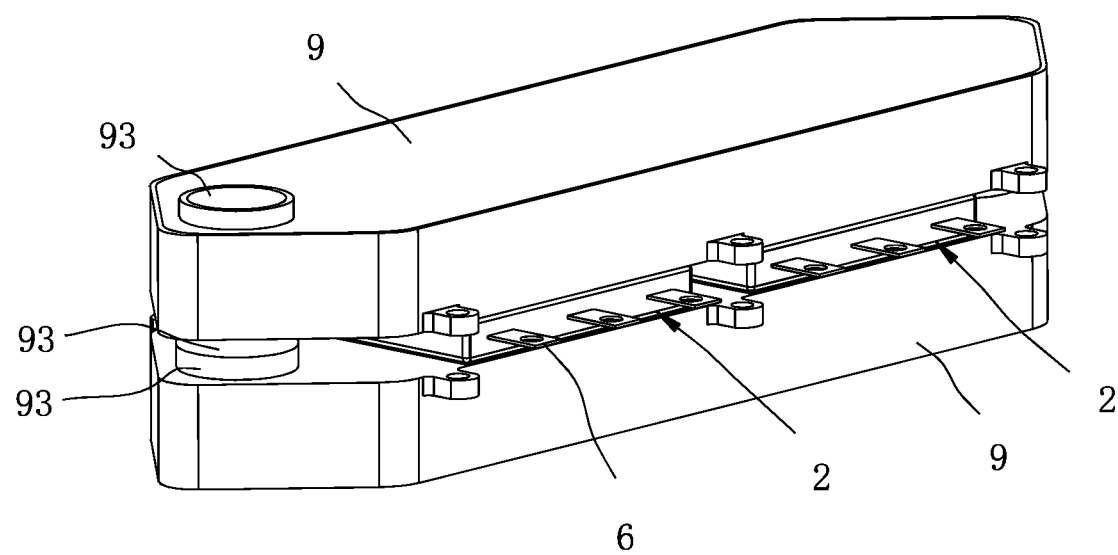
FIG. 9 is a schematic view of a heat sink system according to an embodiment of the present disclosure.
Figure 10:
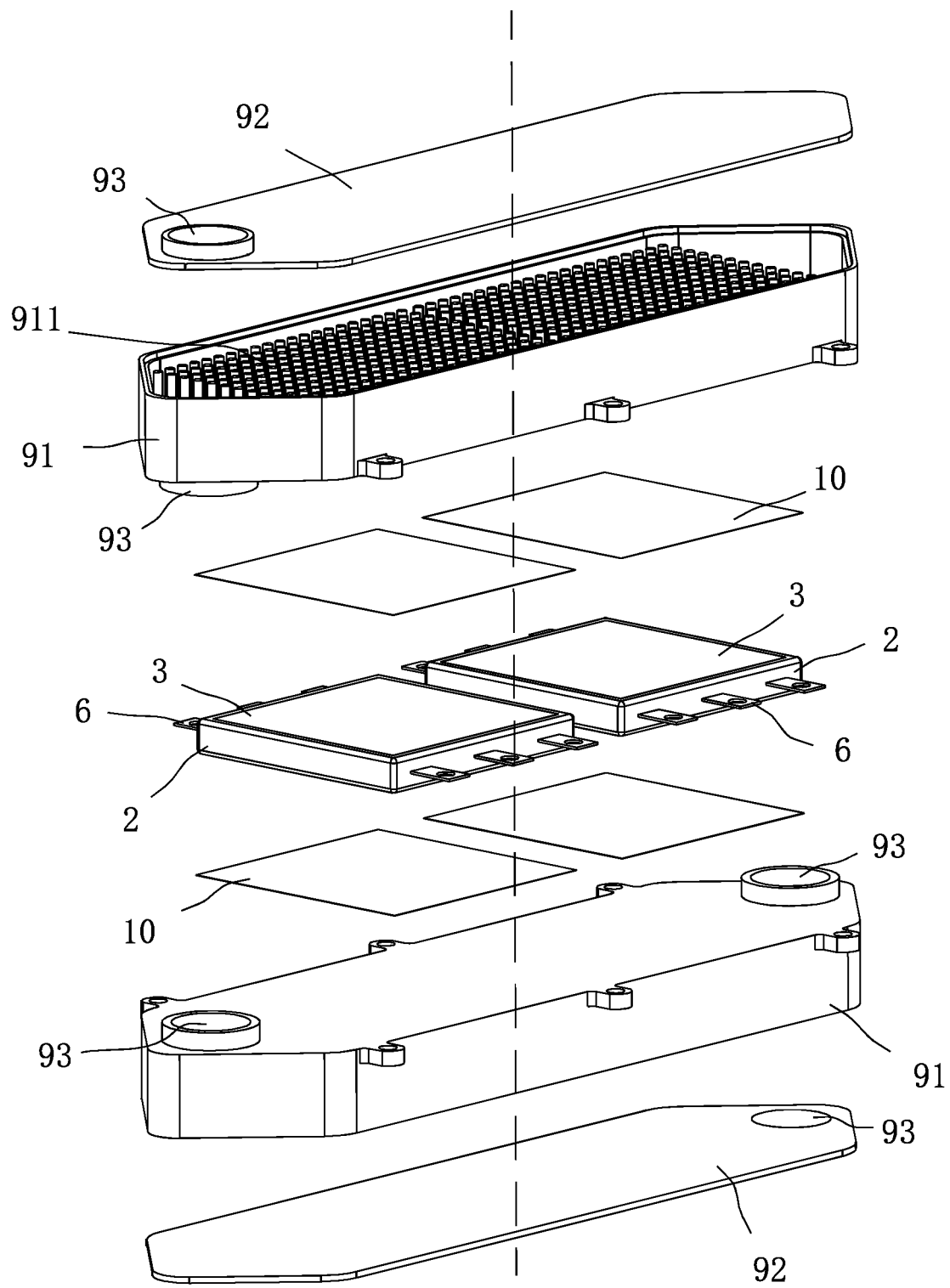
FIG. 10 is an exploded view of a heat sink system according to an embodiment of the present disclosure.

In an embodiment, referring to FIGS. 9 and 10, the present disclosure also provides a heat sink system. The heat sink system includes the preceding power module and also includes a heat sink. The heat sink is disposed on the power module, and the heat sink is connected to the first circuit board 3 and the second circuit board 4. The heat sink can timely dissipate the chip 1 and the circuit structure in the power module, reduce the temperature of the power module, thereby avoiding the damage to the chip 1 or the circuit structure due to the high temperature, and ensuring the operational performance of the power module. With the heat sink, the first circuit board 3 and the second circuit board 4, heat of the discrete components can be dissipated from both sides. In this manner, the heat dissipation effect of the control module can be improved and the damage to the chip 1 due to the high temperature can be avoided.

In this embodiment, the heat sink is connected to the first lateral surface 31 of the first circuit board 3 and the second lateral surface 41 of the second circuit board 4. In this embodiment, the first lateral surface 31 and the second lateral surface 41 are both copper surfaces, and the first lateral surface 31 and the second lateral surface 41 are welded to the heat sink through a solder 10. In this case, the heat on the first circuit board 3 and the second circuit board 4 can be quickly conducted to the heat sink, and the heat sink takes away the power module to avoid heat from accumulating in the power module and ensure the operational performance of the power module.

In an embodiment, referring to FIGS. 9 and 10, the heat sink includes two heat sink members 9, the two heat sink members 9 are electrically connected to the first lateral surface 31 of the first circuit board 3 and the second lateral surface 41 of the second circuit board 4 respectively, a chamber is disposed inside each of the two heat sink members 9, the chamber is configured such that a coolant is able to flow through the chamber, each heat sink member 9 is formed with at least two holes 93 communicating with the chamber, the at least two holes 93 are configured for inflow and outflow of the coolant, at least one hole 93 of one heat sink member 9 communicates with at least one hole 93 of the other heat sink member 9, and the at least two holes 93 are configured such that the coolant is able to flow in through one hole 93 of one heat sink member 9 and flow out through one hole 93 of the other heat sink member 9. In this embodiment, two heat sink members 9 are provided, and the two heat sink members 9 are electrically connected to the first lateral surface 31 and the second lateral surface 41 respectively, at least one hole 93 of one heat sink member 9 communicates with at least one hole 93 of the other heat sink member 9, and the at least two holes 93 are configured such that the coolant is able to flow in through one hole 93 of one heat sink member 9 and flow out through one hole 93 of the other heat sink member 9. In this manner, the piping structure can be simplified.

In an embodiment, each heat sink member 9 includes a heat sink body 91 and a cover plate 92, the heat sink body 91 has one opening, and the cover plate is configured to block the opening so that the chamber is formed. In this embodiment, one heat sink member 9 is formed with three holes 93, two holes 93 are formed in the heat sink body 91, one hole 93 is formed in the cover plate 92, and the two holes 93 in the heat sink body 91 of one of the two heat sink members 9 communicate with the two holes in the heat sink body of the other of the two heat sink members in a one-to-one manner. The heat sink body 91 and the cover plate 92 are combined into the heat sink member 9 so that the manufacturing difficulty of the heat sink member 9 can be reduced, facilitating reducing the cost of the heat sink system. In this embodiment, the coolant flows into the chamber of the lower heat sink member 9 below the second circuit board 4 through the hole 93 in the cover plate 92 of the lower heat sink member 9 and then flows out through the two holes in the heat sink body 91 of the lower heat sink member 9. Since the two holes in the heat sink body 91 of the lower heat sink member 9 communicate with the two holes 93 in the heat sink body 91 of the upper heat sink member 9 above the first circuit board 3 in a one-to-one manner, the coolant can flow into the chamber of the upper heat sink member 9 through the two holes 93 in the heat sink body 91 of the upper heat sink member 9, converge in the chamber of the upper heat sink member 9 and then flow out through the hole 93 in the cover plate 92 of the upper heat sink member 9.

In an embodiment, several heat sink bars 911 protrude from an inner wall of the heat sink body 91, and the heat sink bars 911 are disposed on the inner wall close to one side of the chip 1. The heat sink bars 911 can increase the contact area between the heat sink member 9 and a liquid coolant, and thus the heat dissipation effect exerted by the heat sink on the chip 1, the first circuit board 3 and the second circuit board 4 is enhanced. In this embodiment, heat in the power module is dissipated by liquid cooling. That is, the coolant is a liquid coolant. In other embodiments, the power module can be cooled by air cooling. For example, cold air may be filled into the heat sink member 9 through an inlet of the heat sink member 9, pass through the chamber and then flow out through an outlet of the heat sink member 9. In this manner, the sealing requirement of the heat sink member 9 can be reduced, and a short circuit in the circuit structure caused by a liquid leakage of the heat sink member 9 can be avoided.

In the description of the present disclosure, it is to be understood that the orientation or position relationships indicated by terms "above", "below", "left", "right" and the like are based on the orientation or position relationships shown in the drawings, merely for facilitating description and simplifying operation, and these relationships do not indicate or imply that the referred device or element has an orientation and is constructed and operated in an orientation, and thus it is not to be construed as limiting the present disclosure. In addition, the terms "first" and "second" are used only to distinguish between descriptions and have no special meaning.

In the description of the specification, the description of reference terms "an embodiment" or "example" means that characteristics, structures, materials, or features described in connection with the embodiment or example are included in at least one embodiment or example of the present disclosure. In the specification, the illustrative description of the preceding terms does not necessarily refer to the same embodiment or example.

Moreover, it is to be understood that although this specification is described in terms of the embodiments, not each embodiment includes only one independent technical solution. Such description mode of the specification is merely for the sake of clarity, and those skilled in the art should regard the specification as a whole. The technical solutions in the embodiments may also be appropriately combined to form other embodiments which will be understood by those skilled in the art.

The principle of the present disclosure is described above in conjunction with the embodiments. The description is merely used for explaining the principle of the present disclosure, and is not intended to explain as limitations to the protection scope of present disclosure in any manner. Based on the explanations herein, other embodiments of the present disclosure obtained by those skilled in the art are within the scope of the present disclosure on the premise that no creative work is done.

What is claimed is:

1. A power module, comprising:
a first circuit board;
a second circuit board opposite to and spaced apart from the first circuit board;
at least one discrete component, wherein one of the at least one discrete component comprises a lead frame and at least one chip, the lead frame is disposed between the first circuit board and the second circuit board, the lead frame comprises two end faces and a plurality of mounting lateral surfaces connected in sequence, an angle is formed between one of the two end faces and one of the plurality of mounting lateral surfaces, one of the two end faces is electrically connected to the first circuit board, the other of the two end faces is electrically connected to the second circuit board, and the at least one chip is disposed on at least one of the plurality of mounting lateral surfaces; and
an encapsulation body configured to pot a space between the first circuit board and the second circuit board, wherein the at least one discrete component is embedded in the encapsulation body, a plurality of electrode tabs are encapsulated in the encapsulation body, one end of one of the plurality of electrode tabs is connected to the first circuit board or the second circuit board, and another end of the one of the plurality of electrode tabs extends out of the encapsulation body.

2. The power module of claim 1, wherein a recess is formed in a mounting lateral surface of the plurality of mounting lateral surfaces, and a chip of the at least one chip is disposed in the recess.

3. The power module of claim 1, wherein the lead frame comprises a frame top and a frame bottom, the frame top is connected to the first circuit board, the frame bottom is connected to the second circuit board, the frame top is an integral metal structure, the plurality of mounting lateral surfaces are disposed on the frame top, and the frame bottom comprises at least one first electrode plate and at least one second electrode plate; the frame top, the at least one first electrode plate and the at least one second electrode plate are insulated from each other; and a first electrode of one chip of the at least one chip is electrically connected to one of the at least one first electrode plate, a second electrode of the one chip is electrically connected to one of the at least one second electrode plate, and a third electrode of the one chip is electrically connected to the frame top.

4. The power module of claim 3, wherein the frame bottom comprises one first electrode plate and one second electrode plate, an angle is formed between the one first electrode plate and the one second electrode plate, the one first electrode plate partially overlaps the one second electrode plate, and a first insulating plate is disposed at a position of overlapping between the one first electrode plate and the one second electrode plate.

5. The power module of claim 4, wherein the one first electrode plate is formed with a first slot, the one second electrode plate is formed with a second slot, the first insulating plate is disposed in the second slot, a bottom of the second slot and the first insulating plate are both embedded in the first slot, a lower surface of the one first electrode plate is flush with a lower surface of the one second electrode plate.

6. The power module of claim 3, wherein the frame bottom comprises two first electrode plates and two second electrode plates, the two first electrode plates are staggered and spaced apart to form empty spaces, the two second electrode plates are disposed in the empty spaces in a one-to-one manner, a second insulating plate is disposed between each first electrode plate among the two first electrode plates and a second electrode plate adjacent to the each first electrode plate.

7. The power module of claim 6, wherein a lower surface of the frame top is recessed and formed with a notch, the two first electrode plates and the two second electrode plates are disposed in the notch, the second insulating plate is further disposed between the notch and the first electrode plate and between the notch and the second electrode plate, and lower surfaces of the two first electrode plates and lower surfaces of the two second electrode plates are flush with the lower surface of the frame top.

8. The power module of claim 1, wherein at least one of the following applies:
the first circuit board has a first lateral surface facing away from the lead frame, and the encapsulation body extends to the first lateral surface such that the first lateral surface is partially exposed from the encapsulation body; or
the second circuit board has a second lateral surface facing away from the lead frame, and the encapsulation body extends to the second lateral surface such that the second lateral surface is partially exposed from the encapsulation body.

9. A heat sink system, comprising the power module of claim 1 and further comprising a heat sink, wherein the heat sink is disposed on the power module, and the heat sink is connected to the first circuit board and the second circuit board.

10. The heat sink system of claim 9, wherein the heat sink comprises two heat sink members, the two heat sink members are electrically connected to the first circuit board and the second circuit board respectively, a chamber is disposed inside each of the two heat sink members, the chamber is configured such that a coolant is able to flow through the chamber, the each of the two heat sink members is formed with at least two holes communicating with the chamber, the at least two holes are configured for inflow and outflow of the coolant, at least one of the at least two holes of one of the two heat sink members communicates with at least one of the at least two holes of the other of the two heat sink members such that the coolant is able to flow in through one of the at least two holes of one of the two heat sink members and flow out through one of the at least two holes of the other of the two heat sink members.

11. The heat sink system of claim 10, wherein the each of the two heat sink members comprises a heat sink body and a cover plate, the heat sink body has an opening, and the cover plate blocks the opening so that the chamber is formed, the each of the two heat sink members is formed with three holes, two holes of the three holes are formed in the heat sink body, one of the three holes is formed in the cover plate, and the two holes in the heat sink body of one of the two heat sink members communicate with the two holes in the heat sink body of the other of the two heat sink members in a one-to-one manner.

12. The heat sink system of claim 11, wherein several heat sink bars protrude from an inner wall of the heat sink body.

13. The heat sink system of claim 9, wherein a recess is formed in a mounting lateral surface of the plurality of mounting lateral surfaces, and a chip of the at least one chip is disposed in the recess.

14. The heat sink system of claim 9, wherein the lead frame comprises a frame top and a frame bottom, the frame top is connected to the first circuit board, the frame bottom is connected to the second circuit board, the frame top is an integral metal structure, the plurality of mounting lateral surfaces are disposed on the frame top, and the frame bottom comprises at least one first electrode plate and at least one second electrode plate; the frame top, the at least one first electrode plate and the at least one second electrode plate are insulated from each other; and a first electrode of one chip of the at least one chip is electrically connected to one of the at least one first electrode plate, a second electrode of the one chip is electrically connected to one of the at least one second electrode plate, and a third electrode of the one chip is electrically connected to the frame top.

15. The heat sink system of claim 14, wherein the frame bottom comprises one first electrode plate and one second electrode plate, an angle is formed between the one first electrode plate and the one second electrode plate, the one first electrode plate partially overlaps the one second electrode plate, and a first insulating plate is disposed at a position of overlapping between the one first electrode plate and the one second electrode plate.

16. The heat sink system of claim 15, wherein the one first electrode plate is formed with a first slot, the one second electrode plate is formed with a second slot, the first insulating plate is disposed in the second slot, a bottom of the second slot and the first insulating plate are both embedded in the first slot, a lower surface of the one first electrode plate is flush with a lower surface of the one second electrode plate.

17. The heat sink system of claim 14, wherein the frame bottom comprises two first electrode plates and two second electrode plates, the two first electrode plates are staggered and spaced apart to form empty spaces, the two second electrode plates are disposed in the empty spaces in a one-to-one manner, a second insulating plate is disposed between each first electrode plate among the two first electrode plates and a second electrode plate adjacent to the each first electrode plate.

18. The heat sink system of claim 17, wherein a lower surface of the frame top is recessed and formed with a notch, the two first electrode plates and the two second electrode plates are disposed in the notch, the second insulating plate is further disposed between the notch and the first electrode plate and between the notch and the second electrode plate, and lower surfaces of the two first electrode plates and lower surfaces of the two second electrode plates are flush with the lower surface of the frame top.

19. The heat sink system of claim 9, wherein at least one of the following applies:
   the first circuit board has a first lateral surface facing away from the lead frame, and the encapsulation body extends to the first lateral surface such that the first lateral surface is partially exposed from the encapsulation body; or
   the second circuit board has a second lateral surface facing away from the lead frame, and the encapsulation body extends to the second lateral surface such that the second lateral surface is partially exposed from the encapsulation body.

* * * * *